United States Patent
Bailey et al.

(10) Patent No.: US 10,004,162 B2
(45) Date of Patent: Jun. 19, 2018

(54) ENHANCED FAN DESIGN, CONFIGURATION, AND CONTROL FOR MODULAR, SCALABLE AND EXPANDABLE, RACK-BASED INFORMATION HANDLING SYSTEM

(71) Applicant: DELL, INC., Round Rock, TX (US)

(72) Inventors: Edmond Bailey, Cedar Park, TX (US); Austin Michael Shelnutt, Leander, TX (US); John R. Stuewe, Round Rock, TX (US); Paul W. Vancil, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 719 days.

(21) Appl. No.: 14/139,700

(22) Filed: Dec. 23, 2013

(65) Prior Publication Data

US 2015/0177750 A1    Jun. 25, 2015

(51) Int. Cl.
*H05K 7/20* (2006.01)
*G05D 23/19* (2006.01)

(52) U.S. Cl.
CPC ..... *H05K 7/20736* (2013.01); *G05D 23/1932* (2013.01); *H05K 7/20209* (2013.01); *H05K 7/20836* (2013.01)

(58) Field of Classification Search
CPC .. H05K 7/20; H05K 7/20736; H05K 7/20836; H05K 7/20209; G05D 23/1932
See application file for complete search history.

(56) References Cited

U.S. PATENT DOCUMENTS

| | | | | |
|---|---|---|---|---|
| 6,340,874 B1 * | 1/2002 | Vladimir | ............ | H05K 7/20209 318/461 |
| 7,251,135 B2 * | 7/2007 | Crippen | ............. | H05K 7/20172 165/104.33 |
| 7,426,109 B2 * | 9/2008 | Lindell | ............. | H05K 7/20836 361/679.48 |
| 7,848,105 B2 * | 12/2010 | Holmes | ..................... | G06F 1/20 165/104.33 |
| 7,983,038 B2 * | 7/2011 | Levesque | ............... | H05K 7/186 211/26 |
| 8,749,187 B2 * | 6/2014 | Busch | ..................... | G06F 1/206 318/461 |

(Continued)

*Primary Examiner* — Kenneth M Lo
*Assistant Examiner* — Michael J Huntley
(74) *Attorney, Agent, or Firm* — Isidore PLLC

(57) ABSTRACT

A rack-based information handling system (IHS) includes a rack having a modular structure that supports insertion of different numbers and sizes of information technology (IT) gear to create one or more IT nodes. A fan bay module is attached to the rack and supports insertion of multiple different fan configurations in more than one fan receptacle. At least one fan is inserted within corresponding at least one fan receptacle of the fan bay module to conform to at least a first fan configuration. A block controller is configurable to control each of the different fan configurations and which, in response to detecting the first fan configuration of the at least one fan inserted within the fan bay module, activates a corresponding first control algorithm that enables the detected first fan configuration to be utilized to provide rack-level cooling for one or more of the IT nodes inserted within the rack.

16 Claims, 13 Drawing Sheets

(56) References Cited

U.S. PATENT DOCUMENTS

| | | | |
|---|---|---|---|
| 9,037,309 B2* | 5/2015 | Wang | H05K 7/1498 700/300 |
| 9,223,326 B2* | 12/2015 | Allen-Ware | G06F 11/2023 |
| 9,311,269 B2* | 4/2016 | Davis | G06F 15/177 |
| 2001/0024358 A1* | 9/2001 | Bonet | H05K 7/20581 361/695 |
| 2003/0112601 A1* | 6/2003 | Smith | G06F 1/183 361/695 |
| 2003/0223196 A1* | 12/2003 | Smith | G06F 1/181 361/679.48 |
| 2004/0130872 A1* | 7/2004 | Cravens | H05K 7/20727 361/695 |
| 2005/0024827 A1* | 2/2005 | Espinoza-Ibarra | H05K 7/20736 361/695 |
| 2005/0210896 A1* | 9/2005 | Durant | G06F 1/206 62/178 |
| 2005/0254210 A1* | 11/2005 | Grady | H05K 7/20581 361/695 |
| 2007/0281639 A1* | 12/2007 | Clidaras | G06F 1/20 455/128 |
| 2008/0064317 A1* | 3/2008 | Yates | B65D 88/745 454/118 |
| 2009/0265045 A1* | 10/2009 | Coxe, III | H05K 7/20836 700/300 |
| 2009/0296342 A1* | 12/2009 | Matteson | G06F 1/206 361/679.46 |
| 2012/0010754 A1* | 1/2012 | Matteson | H05K 7/20836 700/282 |
| 2012/0116590 A1* | 5/2012 | Florez-Larrahondo | G06F 1/206 700/275 |
| 2012/0163989 A1* | 6/2012 | Sun | H05K 7/20718 416/244 R |
| 2012/0215359 A1* | 8/2012 | Michael | G06F 1/206 700/275 |
| 2012/0224322 A1* | 9/2012 | Artman | G06F 1/20 361/679.48 |
| 2012/0268890 A1* | 10/2012 | Stock | G06F 1/20 361/679.53 |
| 2013/0060350 A1* | 3/2013 | Peterson | G06F 1/26 700/12 |
| 2013/0151011 A1* | 6/2013 | Shih | H05K 7/20836 700/275 |
| 2013/0288588 A1* | 10/2013 | Shih | G06F 1/206 454/256 |
| 2013/0333871 A1* | 12/2013 | Pimlott | G06F 1/206 165/287 |
| 2014/0074261 A1* | 3/2014 | Wang | H05K 7/20836 700/90 |
| 2014/0277784 A1* | 9/2014 | Mick | G05D 23/1917 700/286 |

* cited by examiner

ENHANCED FAN DESIGN, CONFIGURATION, AND CONTROL FOR MODULAR, SCALABLE AND EXPANDABLE, RACK-BASED INFORMATION HANDLING SYSTEM

BACKGROUND

1. Technical Field

The present disclosure generally relates to an information handling system and in particular to a cooling system for a modular, scalable, and expandable rack-based information handling system and design.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As information handling systems operate, the various processing and other electrical components dissipate heat. Thus one important consideration in the design of all information handling systems is how to provide sufficient cooling for these components such that the components and by extension the information handling system does not overheat. Conventionally, the information handling system is designed with heat fins and internal fans that operate to move the heat away from the device by convection. These fans are local to and designed within the chassis of the information handling system. Even with large scale rack systems comprising multiple servers, each server is designed to locally control its ambient temperature and includes an internal fan and temperature control firmware to maintain the individual server systems within its operating temperature range. Generally-known fan controllers of each server control a fixed fan configuration and require a significant amount of hardware per node within the server. For example, generally-known fan controllers support a single chassis and fixed set of fans. There are rack level configurations where a controller supports a single wall of fans behind a large number of nodes.

BRIEF SUMMARY

The illustrative embodiments of the present disclosure provide a rack-based information handling system (RIHS), cooling system, and method that implements a scalable and modular fan design with centralized rack-level control within a modular, scalable IHS rack having different numbers and sizes of information technology (IT) gear. According to one aspect, the RIHS includes: a rack having a modular structure that supports insertion of different numbers and sizes of IT gear to create one or more IT nodes; a fan bay module attached to the rack and which supports insertion of multiple different fan configurations in more than one fan receptacle; at least one fan inserted within at least one corresponding fan receptacle of the fan bay module to conform to at least a first fan configuration; and a block controller that is configurable to control each of the different fan configurations and which, in response to detecting the first fan configuration of the at least one fan inserted within the fan bay module, activates a corresponding first control algorithm that enables the detected first fan configuration to be utilized to provide rack-level cooling for one or more of the IT nodes inserted within the rack.

According to at least one aspect of the present disclosure, a cooling system is provided for an IHS having a rack configured with a modular structure that supports insertion of different numbers and sizes of IT gear to create one or more IT nodes. The cooling system includes: a fan bay module attached to the rack and which supports insertion of multiple different fan configurations in more than one fan receptacle; at least one fan inserted within corresponding fan receptacle/s of the fan bay module to conform to at least a first fan configuration; and a block controller that is configurable to control each of the different fan configurations and which, in response to detecting the first fan configuration of the at least one fan inserted within the fan bay module, activates a corresponding first control algorithm that enables the detected first fan configuration to be utilized to provide rack-level cooling for one or more of the IT nodes inserted within the rack.

According to at least one aspect of the present disclosure, a method is provided that includes: attaching to a rear of the modularly-configured rack a fan bay module having multiple fan receptacles that supports insertion of fans in multiple different fan configurations; inserting at least one fan within the fan bay module to conform to at least a first fan configuration; provisioning a block controller to control each of the different fan configurations by installing more than one fan control algorithm; and configuring the block controller with firmware to detect the first fan configuration and activate a corresponding first control algorithm that enables the detected first fan configuration to be utilized to provide rack-level cooling for one or more IT nodes inserted within the rack.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
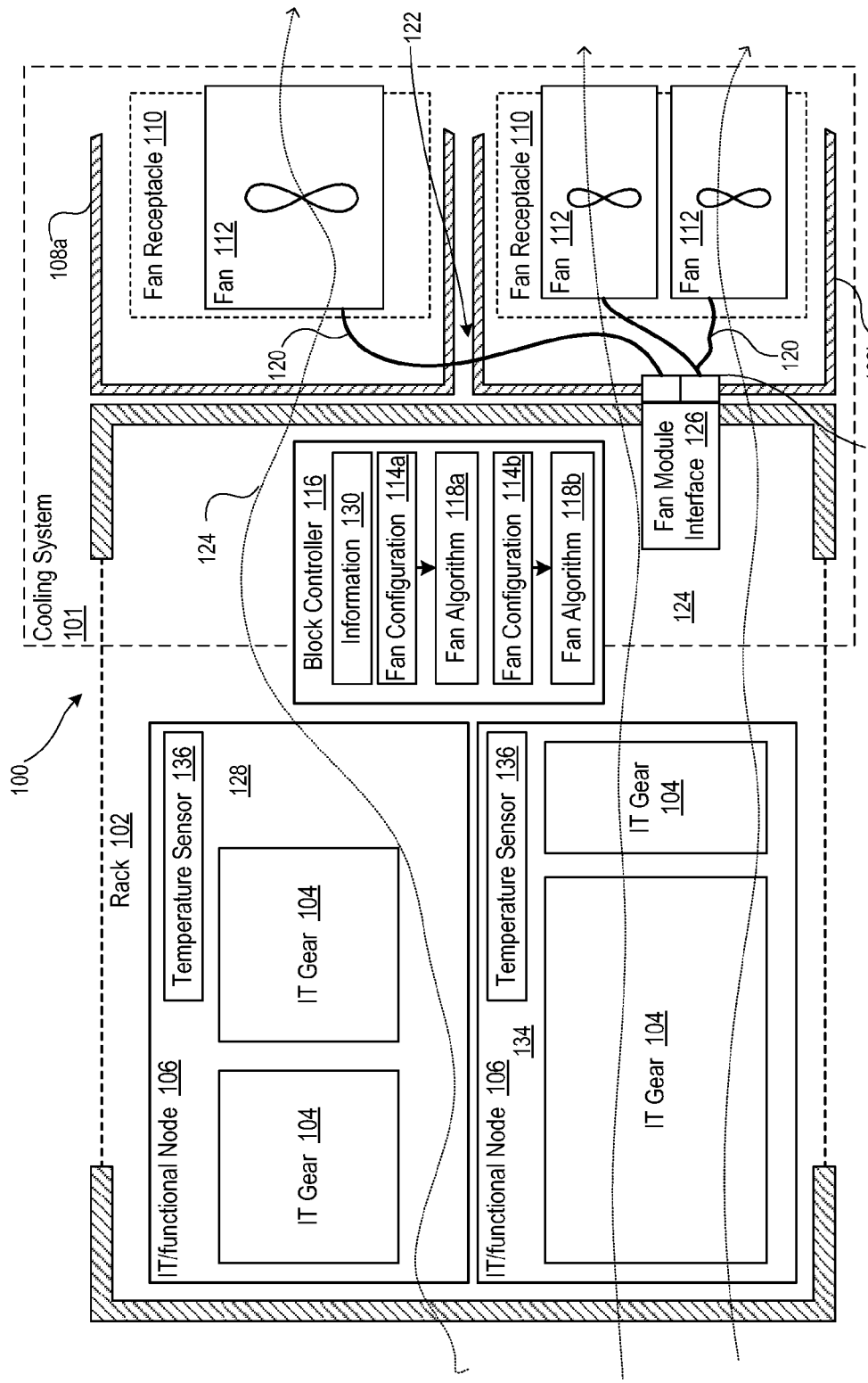
FIG. 1 illustrates a block diagram of an example information handling system (IHS) within which various aspects of the disclosure can be implemented, according to one or more embodiments.

A centralized rack-level control is provided for an information handling system (IHS) rack that is configured with a modular structure that supports insertion of different numbers and sizes of information technology (IT) gear to create one or more IT nodes. A fan bay module is attached to the rack and supports insertion of multiple different fan configurations in more than one fan receptacle. At least one fan is inserted within corresponding at least one fan receptacle of the fan bay module to conform to at least a first fan configuration. A fan block controller is configurable to control each of the different fan configurations and which, in response to detecting the first fan configuration of the at least one fan inserted within the fan bay module, activates a corresponding first control algorithm that enables the detected first fan configuration to be utilized to provide rack-level cooling for one or more of the IT nodes inserted within the rack.

In one or more embodiments, fan configurations have different number of fans and/or different sizes of fans in each single fan bay module that are separately controllable via the single block controller. In one embodiment, the block controller can control the speed of the fan based on information about the IT gear located at the at least one cooling zone and a relative size and number of fans within the one or more fan bay modules that service the at least one cooling zone.

In one embodiment, the block controller: (a) detects a respective fan configuration of the multiple different fan configurations for more than one cooling zone; (b) detects a sensed temperature from a respective temperature sensor corresponding to the more than one cooling zone; (c) activates a corresponding control algorithm that enables the detected respective fan configuration to be utilized to provide rack-level cooling for the one or more IT nodes of the more than one cooling zone; and (d) triggers a fan speed of the one or more fans of a particular fan bay module based on a sensed temperature from the at least one temperature sensor at the corresponding cooling zone serviced by the fan bay module.

In one embodiment, multiple different fan configurations are associated respectively with a corresponding unique wiring configuration that is electrically communicated by the one or more cables to the fan module interface. The block controller determines a fan configuration of each fan bay module based on the wiring configuration sensed at the fan module interface. For example, the corresponding unique wiring configuration can be a selected one or more of a number of the one or more cables, a first subset of allowable conductors of a cable connector of the one or more cables, and a second subset of conductors of the one or more cable connectors that are in electrical communication with the at least one fan.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others.

Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

FIG. 1 illustrates a cooling system 101 of a rack-based IHS (RIHS) 100 that provides flexible and scalable control of fans to support full width, half width, third width, etc., sleds. Generally-known fan controllers control a fixed fan configuration and require a significant amount of hardware per node. For example, generally-known fan controllers support a single chassis and fixed set of fans. There are rack level configurations where a controller supports a single wall of fans behind a large number of nodes. By contrast, the example cooling system 101 incorporates a flexible solution that reduces these hardware requirements. In particular, the cooling system 101 can be a number of nodes and fans without limiting where those nodes and fans are within the RIHS 100.

In one embodiment, the cooling system 101 includes a rack 102 having a modular structure that supports insertion of different numbers and sizes of IT gear 104 to create one or more IT nodes 106. At least one fan bay module 108a, 108b is attached to the rack 102 and supports insertion of multiple different fan configurations in more than one fan receptacle 110. At least one fan 112 is inserted within corresponding at least one fan receptacle 110 of the fan bay module 108a, 108b to conform to at least a first fan configuration 114. A block controller 116 is configurable to control each of the different fan configurations 114. In particular, the block controller 116, in response to detecting the fan configuration 114 of the at least one fan 112 inserted within the fan bay module 108a, 108b, can activate a corresponding first control or fan algorithm 118 that enables the detected first fan configuration 114 to be utilized to provide rack-level cooling for one or more of the IT nodes 106 inserted within the rack 102.

In one embodiment, the cooling system 101 can be configured to address specific requirements of different portions of the rack 102. For example, at least one cooling zone 124 can be identified within the rack 102 that corresponds to a first location 128 of one or more IT nodes 106 that require cooling by one or more fans 112 within the fan bay module 108a, 108b. A cooling zone 124 corresponds to a group of fans 112 that, in accordance with an appropriate fan algorithm 118, run at the same speed based on a sensed temperature to cool assigned IT gear 104. The block controller 116 can be further configured to control speed of the fan 112 based on information 130 that sets default cooling requirements for the IT gear 104 located at the at least one cooling zone 124 and a relative size and number of fans 112 within the one or more fan bay modules 108a, 108b that service the at least one cooling zone 124.

In one embodiment, the cooling system 101 can sense temperatures at more than one location, for clarity illustrated as first location 128 and a second location 134 within the rack 102. In particular, at least one cooling zone 124 can be identified within the rack 102 that corresponds to a location 128 of one or more IT nodes 106 that require cooling by one or more fans 112 within the fan bay module 108a, 108b. To sense these temperatures, the cooling system 101 includes at least one temperature sensor 136 positioned within a location 128 of each IT node 106 corresponding to each cooling zone 124 serviced by fans 112 within the fan bay module 108a, 108b. Each fan receptacle 110 of the fan bay module 108a, 108b can be delineated according to which cooling zone 124 is serviced by fans 112 placed at the specific fan receptacle 110 within the fan bay module 108a, 108b. The block controller 116 can be configurable to (a) detect a respective fan configuration 114 of the multiple different fan configurations 114 for the more than one cooling zone 124; (b) detect a sensed temperature from a respective temperature sensor 136 corresponding to the specific cooling zone 124; (c) activate a corresponding control or fan algorithm 118 that enables the detected respective fan configuration 114 to be utilized to provide zone specific cooling for the one or more IT nodes 106 of the more than one cooling zone 124; and (d) trigger a fan speed of the one or more fans 112 of a particular fan bay module 108a, 108b based on a sensed temperature from the at least one temperature sensor 136 at the corresponding cooling zone 124 serviced by the fan bay module 108a, 108b.

In an exemplary embodiment, the fan bay module 108a, 108b allows for modularity of the fan cable/connection configuration, depicted for clarity as a fan cable 120 that communicates with one or more fan bay modules 108a, 108b. The type or number of fan cable 120 and/or detectable presence of a fan 112 in communication with particular conductors of the fan cable 120 present a wiring configuration 122. The wiring configuration 122 is associated with the fan configuration 114 and is detectable by the cooling system 101. In particular, the block controller 116 of the cooling system 101 can recognize the fan configuration 114 and implement an appropriate fan algorithm 118 for the type and number of fans 112.

Each cooling zone 124 of the IT rack 102 can have a different fan configuration 114 in order to optimize the cooling and power for the IT gear 104 within each cooling zone 124. This can be applied to many configurations and fan sizes. For example, the fan bay module 108a, 108b can support insertion of multiple different fan configurations including a first fan configuration 114a having a first number of fans 112 within a single fan bay module 108a and second fan configuration 114b having a second number of fans 112 within a single fan bay module 108b. Each fan bay module 108a, 108b can be assigned to cool a different set of components, illustrated as IT gear 104, within the rack 102. In an exemplary embodiment, the two fan bay modules 108a, 108b can be separately controlled via the single block controller 116.

In at least one embodiment, the block controller 116 includes, or communicates with, a fan module interface 126 that in turn communicates via the one or more fan cables 120 with the fans 112. The block controller 116 performs fan control for the cooling system 101. To that end, the block controller 116 receives signals from (e.g., tachometer readings) and transmits power to (e.g., pulse width modulation) the fan bay module 108a, 108b and the at least one fan 112 via the fan module interface 126. According to one aspect of the disclosure, the multiple different fan configurations 114 are associated respectively with a corresponding unique wiring configuration 122 that is electrically communicated by the one or more fan cables 120 to the fan module interface 126. For example, the corresponding unique wiring configuration 122 can be one or more of (a) a number of fan cables, and (b) a first subset of allowable conductors of a cable connector 132 of the one or more fan cables 120 and a second subset of conductors of the one or more cable connectors 132 that are in electrical communication with the at least one fan 112.

Figure 2:
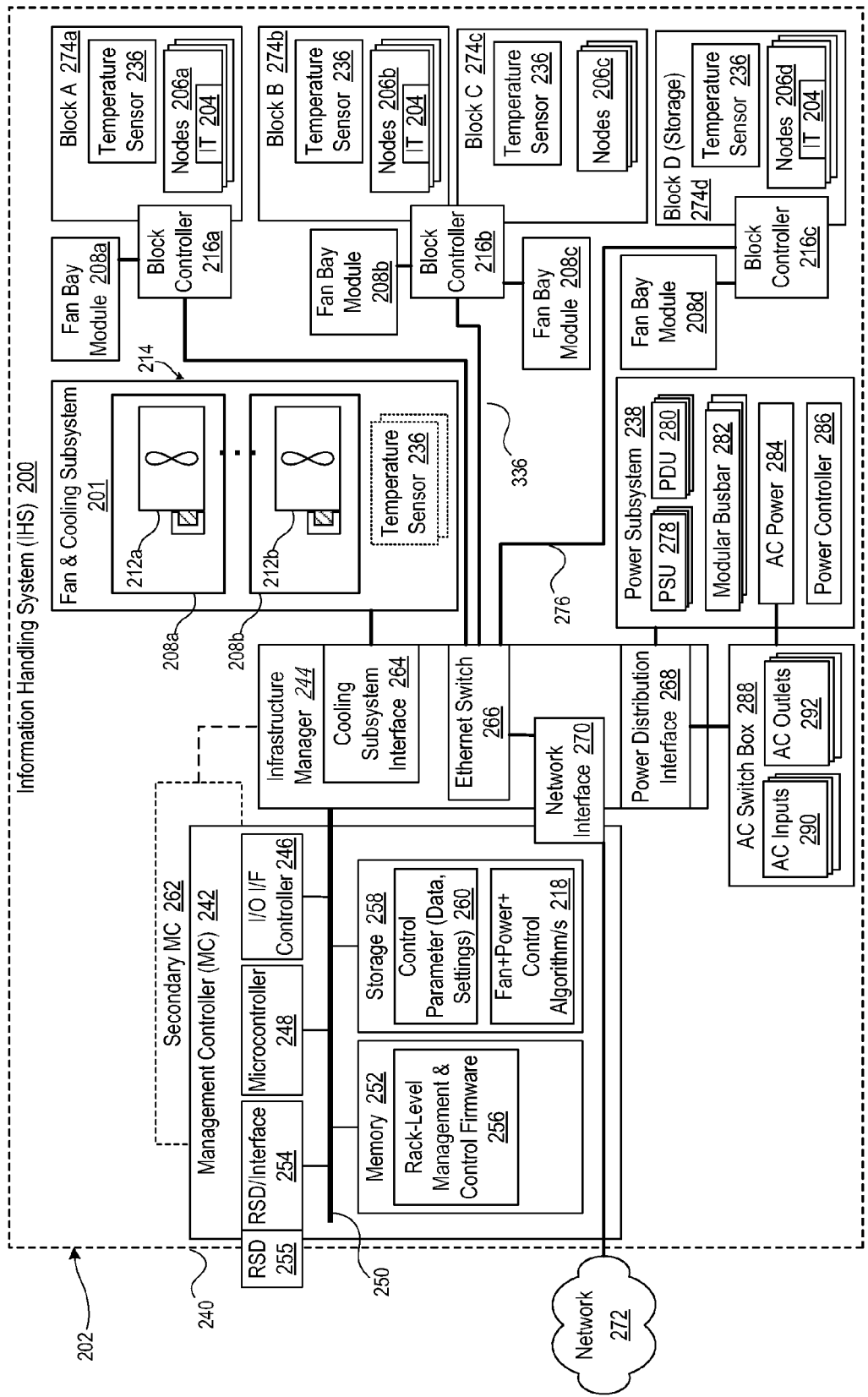
FIG. 2 illustrates a block diagram of an example IHS within which various aspects of the disclosure can be implemented, according to one or more embodiments.

FIG. 2 illustrates a block diagram representation of an example IHS 200, within which one or more of the described features of the various embodiments of the disclosure can be implemented to provide flexible and scalable control of multiple fan configurations 214. For example, the IHS 200 can be an example implementation of the RIHS 100 (FIG. 1). For purposes of this disclosure, an information handling system, such as IHS 200, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

With continued reference to FIG. 2, there is illustrated a two-dimensional block diagram of an example rack-based IHS 200 configured as a modular, expandable rack 202 with modular configuration of various functional components inserted therein. As a two-dimensional image, certain of the presented components are shown in different orientations relative to each other for simplicity in describing the connectivity of the components. For example, while certain components are shown separate from a power subsystem 238, in actual implementation, these components can be located on several of the components of the power subsystem 238. Similarly, while the power subsystem 238 is shown with specific components within a single block 274a-274d, each of these components is not necessarily contained in a unitary structure. For example, the busbar 282 can be modularly extended along the entire vertical run of the rack 202 with only one sub-section in connection with the actual power bay. For purposes of the disclosure all general references to an information handling system shall refer to the rack-based IHS 200, while references to actual processing nodes 206 within the IHS 200 shall be referenced as chassis level processing nodes 206 or IT gear 204. It is further appreciated that within the rack-based IHS 200 can be implemented separate domains or systems that are independent of each other and can be assigned to different independent customers and/or users. However, this level of detail of the actual use of the processing nodes 206 within the general rack-based IHS 200 is not relevant to the descriptions provided herein and are specifically omitted.

As presented in FIG. 2, IHS 200 includes a rack casing 240, which can comprise one or more panels of sheet metal or other material interconnected to form a three dimensional volume generally referred to in the industry as a rack. Unique aspects of the rack casing 240, which add to the modularity and expandability of rack-based IHS 200, are further illustrated and described in one or more of the three-dimensional figures presented herein. As is further presented by these three-dimensional figures, certain components indicated herein are located internal to the rack casing 240 while other components can be located external to rack casing 240. These various components are communicatively connected to one or more components via power and communication cables, which are generally represented by the connecting lines of FIG. 2.

Rack-based IHS 200 comprises a hierarchical arrangement of multiple management modules, along with power and cooling components, and functional processing components or IT gear within end nodes. At the rack level, IHS 200 includes a management controller (MC) 242 communicatively connected to infrastructure manager/module (IM) 244. MC 242 can also be referred to as a Rack Management Controller (RMC). MC 242 includes a microcontroller 248 (also generally referred to as a processor) which is coupled via an internal bus 250 to memory 252, I/O interface controller 246, removable storage device (RSD) interface 254 and storage 258. Memory 252 can be flash or other form of memory. Illustrated within memory 252 is rack-level power management and control (RPMC or PMC) firmware 256, which is inclusive of the firmware that controls the operation of MC 242 in communicating with and managing the down-stream components (i.e., blocks 274A-D and processing nodes 206A-D, etc.) of rack-based IHS 200. I/O interface controller 246 provides connection points and hardware and firmware components that allow for user interfacing with the MC 242 via one or more connected I/O devices, such as a keyboard, a mouse, and a monitor. I/O interface controller 246 enables a user to enter commands via, for example, a command line interface (CLI), and to view status information of rack-based IHS 200. I/O interface controller 246 also enables the setting of operating parameters for rack-based IHS 200, among other supported user inputs. RSD interface 254 enables insertion or connection of a RSD 255, such as a storage device (SD) card containing pre-programmable operating firmware for rack-based IHS 200. In at least one embodiment, a RSD 255 stores a copy of the operating parameters of rack-based IHS 200 and the RSD 255 can be utilize to reboot the rack-based IHS 200 to its operating state following a system failure or maintenance shutdown. Storage 258 can be any form of persistent storage and can include different types of data and operating parameters (settings) 260 utilized for functional operation of rack-based IHS 200. Among the stored content within storage 258 can also be algorithms 218 for fan and/or power and/or control. In one or more embodiments, rack-based IHS 200 can optionally include at least one other MC, illustrated as secondary MC 262, to provide a redundant configuration of MCs 242/262 which are both simultaneously active and functioning. With these embodiments, the redundant configuration enables rack-based IHS 200 to continue operating following a failure of either of the MCs 242/262 or in the event one of the MCs 242/262 has to be taken offline for maintenance.

Infrastructure manager 244 includes cooling subsystem interface 264, Ethernet switch 266, power distribution interface 268 and network interface 270. Network interface 270 enables rack-based IHS 200 and specifically the components within rack-based IHS 200 to connect to communicate with or via an external network 272.

In addition to the above described MC 242 and IM 244, rack-based IHS 200 further comprises a fan and cooling subsystem 201, power subsystem 238, and a plurality of processing blocks 274a-274d, individually labeled as blocks A-D 274a-274d. In one implementation, each block 274a-274d has an associated block controller (BC) 216. Cooling subsystem 201 includes a plurality of fan modules, or merely "fans", of which a first fan 212a and a second fan 212b are shown. These fans 212a, 212b are located within a respective fan bay module 208 and can be different sizes and provide different numbers of fans 212 per fan bay module 208. Also included within cooling subsystem 201 is a plurality of temperature sensors 236, which are further shown distributed within or associated with specific blocks 274a-274d.

Cooling subsystem 201 of rack-based IHS 200 further includes some design features of the rack casing 240, such as perforations for air flow and other design features not expanded upon within the present description. Each fan bay module 208a-208b is located behind (or in the air flow path of) a specific block 274a-274d and the fan 212a-212b is communicatively coupled to and controlled by the block controller 216 associated with that block 274a-274d. Within each block 274a-274d is at least one, and likely a plurality, of functional/processing nodes 206a-d. As one aspect of the disclosure, the number of nodes that can be placed within each block and/or supported by a single block controller 216 can vary up to a maximum number (e.g., 16) based on the block dimension relative to the size and configuration of each processing node 206. Additionally, as provided by block D 274d, one or more of the blocks can be utilized to provide rack-storage of storage devices. Also, as shown with blocks B 274b and C 274c, a single block controller 216b can be assigned to control multiple blocks 274b-274c, when the number of processing nodes 206 within an individual block does not exceed the pre-established block controller (BC) threshold. In at least one implementation, the BC threshold can be set to 16 nodes. Each node 206 controlled by a respective block controller 216 is communicatively coupled to block controller 216 via one or more cables.

Switch 266 enables MC 242 to communicate with block controllers 216 via a network of Ethernet cables 276. Specifically, according to at least one embodiment, MC 242 provides certain control and/or management signals to BCs 216 via one or more select wires within the Ethernet cables 276, which select wires are additional wires within the Ethernet cable 276 that are not utilized for general system and network communication.

Power subsystem 238 generally includes a plurality of power supply units (PSUs) 278, one or more power distribution units (PDUs) 280, and a modular busbar 282. Power subsystem 238 also includes a source of external power (not shown), assumed to be AC power 284. Each of the individual nodes 206 and other components within the rack-based IHS 200 that require power are either directly coupled to modular busbar 282 or coupled via power cables to PDUs 280 to obtain power. As one aspect of power distribution within rack-based IHS 200, MC 242 can monitor power consumption across the rack-based IHS 200 as well as the amount of available power provided by the functional PSUs 278 and trigger changes in power consumption at the block level and ultimately at the (processing) node level based on changes in the amount of available power and other factors. Control of the power subsystem 238 can, in one embodiment, be provided by a separate power controller 286, separate from MC 242. As further illustrated, one additional aspect of the power subsystem 238 for the rack-based IHS 200 is the inclusion of AC Switch Box 288. AC switch box 288 is communicatively coupled to both IM 244 and power subsystem 238. AC switch box 288 includes a plurality of AC inputs 290 and a plurality of AC outlets 292 that are utilized to supply power to the PSUs 278, and other functional components of the rack-based IHS 200 that require AC power 284.

In an exemplary embodiment, components of the rack-based IHS 200 are organized into a hierarchy as described in TABLE A:

TABLE A

| Level | Device/Module | Acronym | Comments |
|---|---|---|---|
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |
| Domain Level | Power Bay | Power Bay | Holds PBPM, MCx2, IM, & ACSB |
| Block Level | Block Controller | BC | Hot plug Fan controller + Serial & node interface |
| Block Level | Block Controller Distribution Board (BCDB) | BCDB | Fixed in Block |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | x4HDDBP | Used in 12 drive FW HP sled |
| Node level | 2 drive HDD PB | x2HDDBP | Used for HP 2.5" in HW sled |

Further, those of ordinary skill in the art will appreciate that the hardware components and basic configuration depicted in the various figures and described herein may vary. For example, the illustrative components within rack-based IHS 200 are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

In one embodiment, the fan bay module 208 can respectively support two fan configurations 214 each of different size of fans 212. Alternatively or in addition, the fan bay module 208 can respectively support two fan configurations 214 each of different number of fans 212. In an exemplary embodiment, the fan bay modules 208a, 208b are identical but receive fans 212 in a different number and/or a different size or type to conform to the two fan configurations 214. For example, each cooling zone 224 of the one or more fan bay modules 208 can accept three (3) 120 mm fans, six (6) 120 mm fan, twelve (12) 60 mm fans, or twenty-four (24) 60 mm fans.

Figure 3:
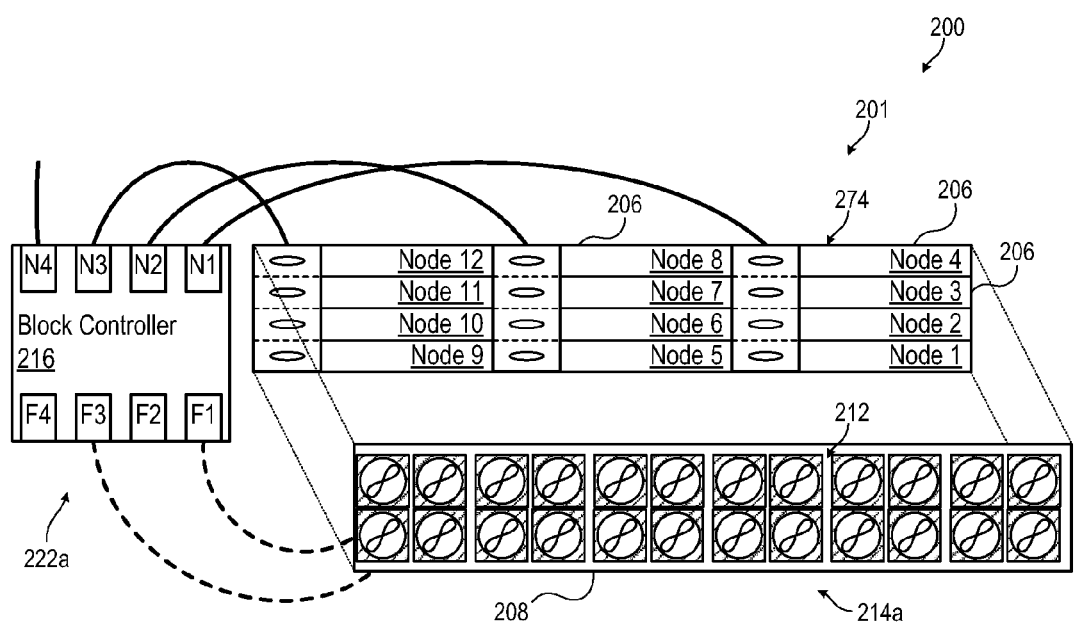
FIG. 3 illustrates a block diagram of an information technology (IT) gear of an IHS arranged into a one-third width 3×4 capable block having twelve nodes cooled by a fan bay module having one cooling wall and three double 4×4 banks of fans, according to one embodiment.
Figure 4:
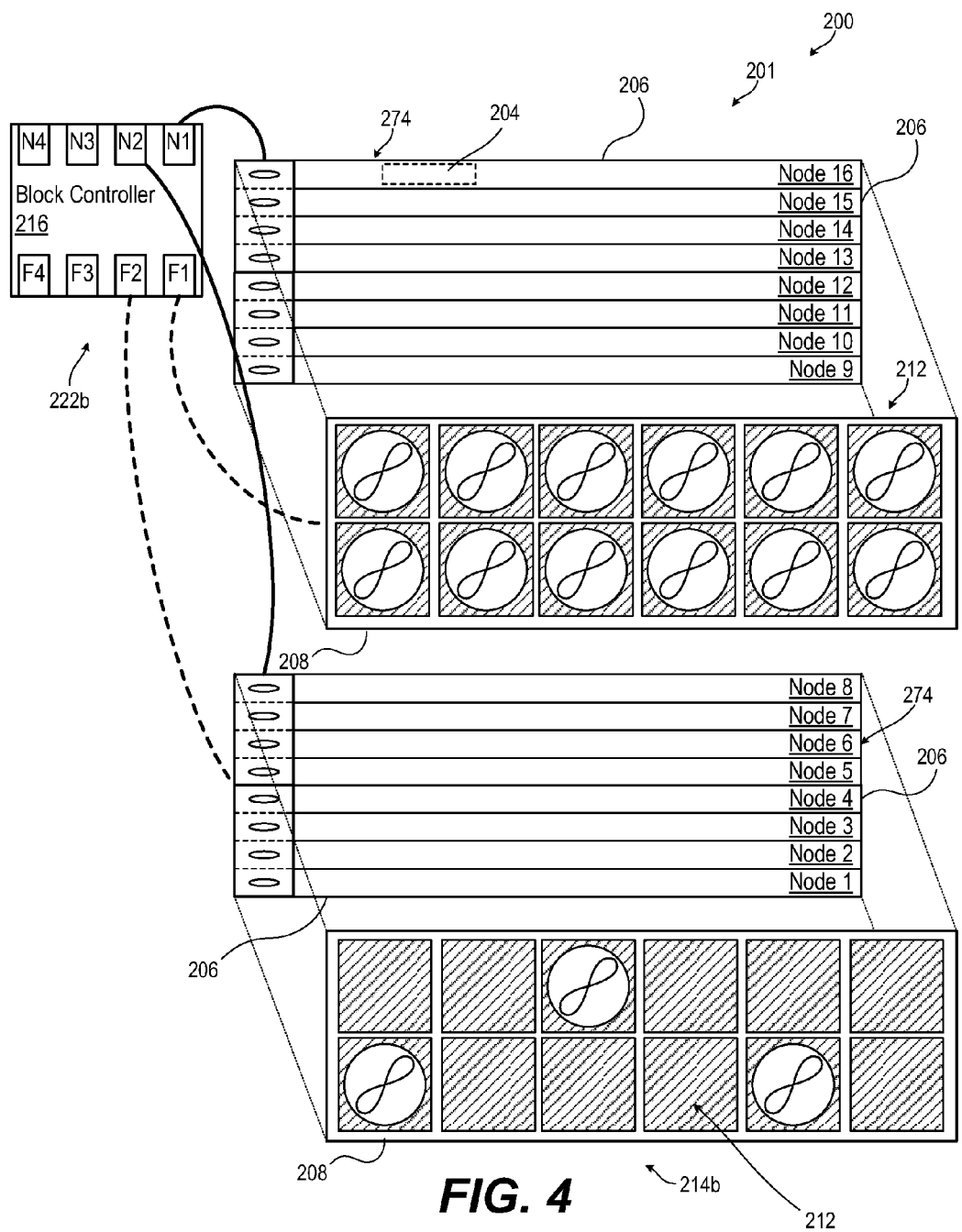
FIG. 4 illustrates IT gear in two full width blocks of eight nodes each cooled by two fan bay modules receptacles of three to twelve fans each for a moderate power cooling system, according to one embodiment.
Figure 5:
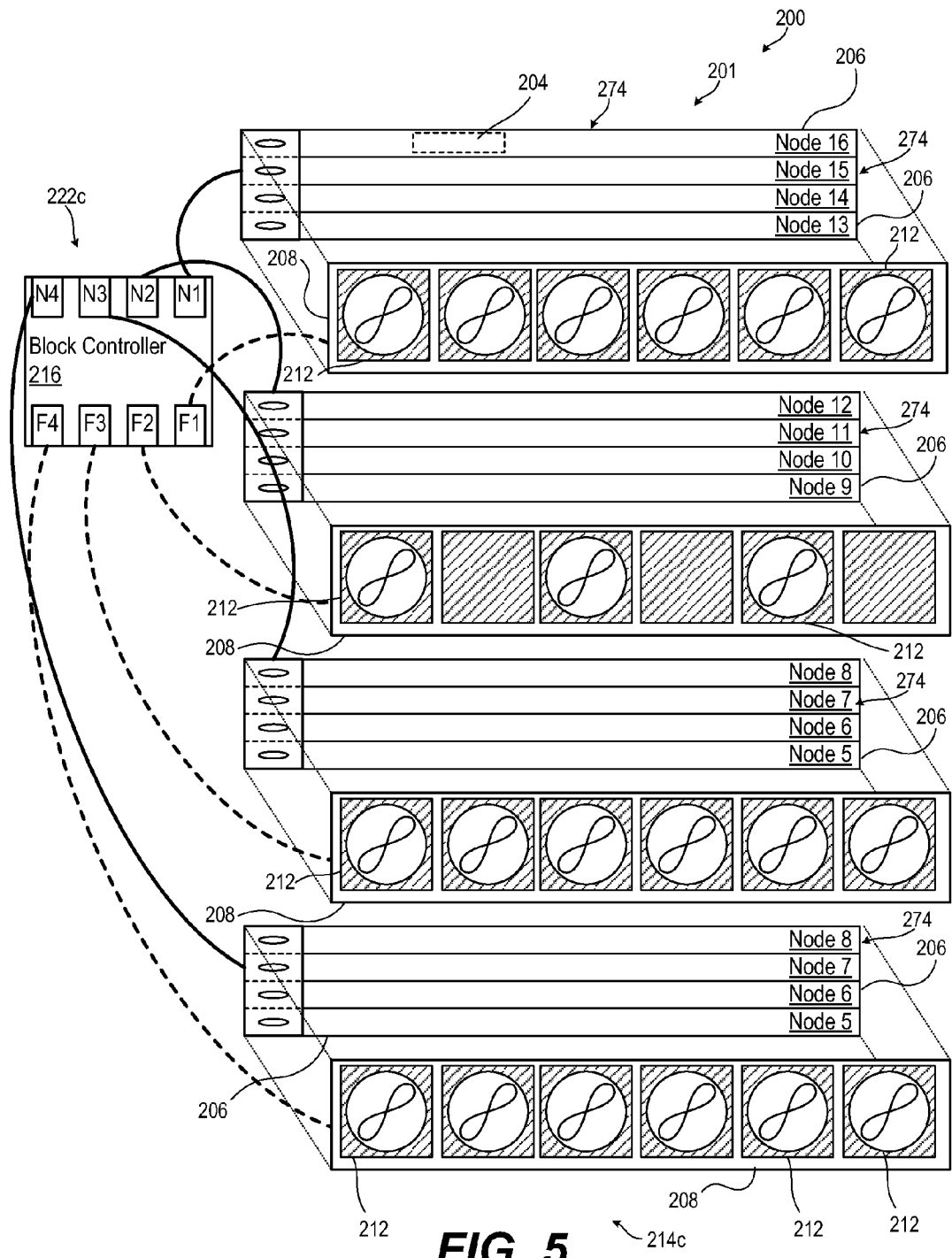
FIG. 5 illustrates IT gear arranged into four full width capable blocks of four nodes each cooled by four fan bay modules, each with three to six fans, according to one embodiment.

FIGS. 3-5 illustrate a single block controller 216 supporting examples of various fan configurations 214a-214c, respectively, of a cooling subsystem 201 of a rack-based IHS 200. FIG. 3 illustrates a high density fan configuration 214a where the block controller 216 supports the cooling requirements of one block 274. For example, the block controller 216 can support a high density cooling requirement of twelve (12) IT nodes 206 behind a single fan wall provided by a fan bay module 208 with up to twenty-four (24) fans 212 inserted. For instance, the fans 212 can be arranged in three double 4×4 banks. For example in an exemplary embodiment, block controller/block controller distribution board (BC/BCDB) connection rules can entail that one-third-width capable blocks 274 have a block controller 216 for every block 274. Block controller 216 provides possible interfaces N1-N4 for nodes 206 and F1-F4 for fans. A unique wiring configuration 222a for high density can require that interfaces N1-N3, F1 and F3 be used with N4 and F4 remaining unused.

Although not illustrated in FIG. 3, a wiring configuration for half-width capable blocks can be connections between interfaces N1, N2 and F1 of the block controller 216 to a first local block 274. The block above the first local block 274 could omit its own block controller and be serviced by interfaces of N3, N4 and F2 of the single block controller 216. Similarly, full-width capable blocks can connect N1 and F1 to the local block 274. The first block above the block controller 216 can use N2 and F2. The second block above the block controller 216 can use N3 and F3. The third block above the block controller 216 can use N4 and F4. Thus, the block controller 216 can detect another unique wiring configuration.

In addition, the block controller 216 can support a mid-range power density. FIG. 4 illustrates IT gear 204 in two full width capable blocks 274a-274d of eight nodes 206 each cooled by two fan bay modules 208 of three to twelve fans 212 each. This configuration provides a moderate power cooling system 101, according to one embodiment. A unique wiring configuration 222b can be detected with the N1 and F1 connected to one fan bay module 208 and N2 and F2 connected to the other fan bay module 208.

As another example, the block controller 216 can support a low-density cooling requirement. FIG. 5 illustrates IT gear 204 arranged into four full width capable blocks 274 of four nodes 206 each cooled by four fan bay modules 208, each with three to six fans 212, according to one embodiment. A unique wiring configuration 222c can be detected based on connections N1 and F1 to the first block 274, N2 and F2 to the second block 274, N3 and F3 to the third block 274, and N4 and F4 to the fourth block 274.

Figure 6:
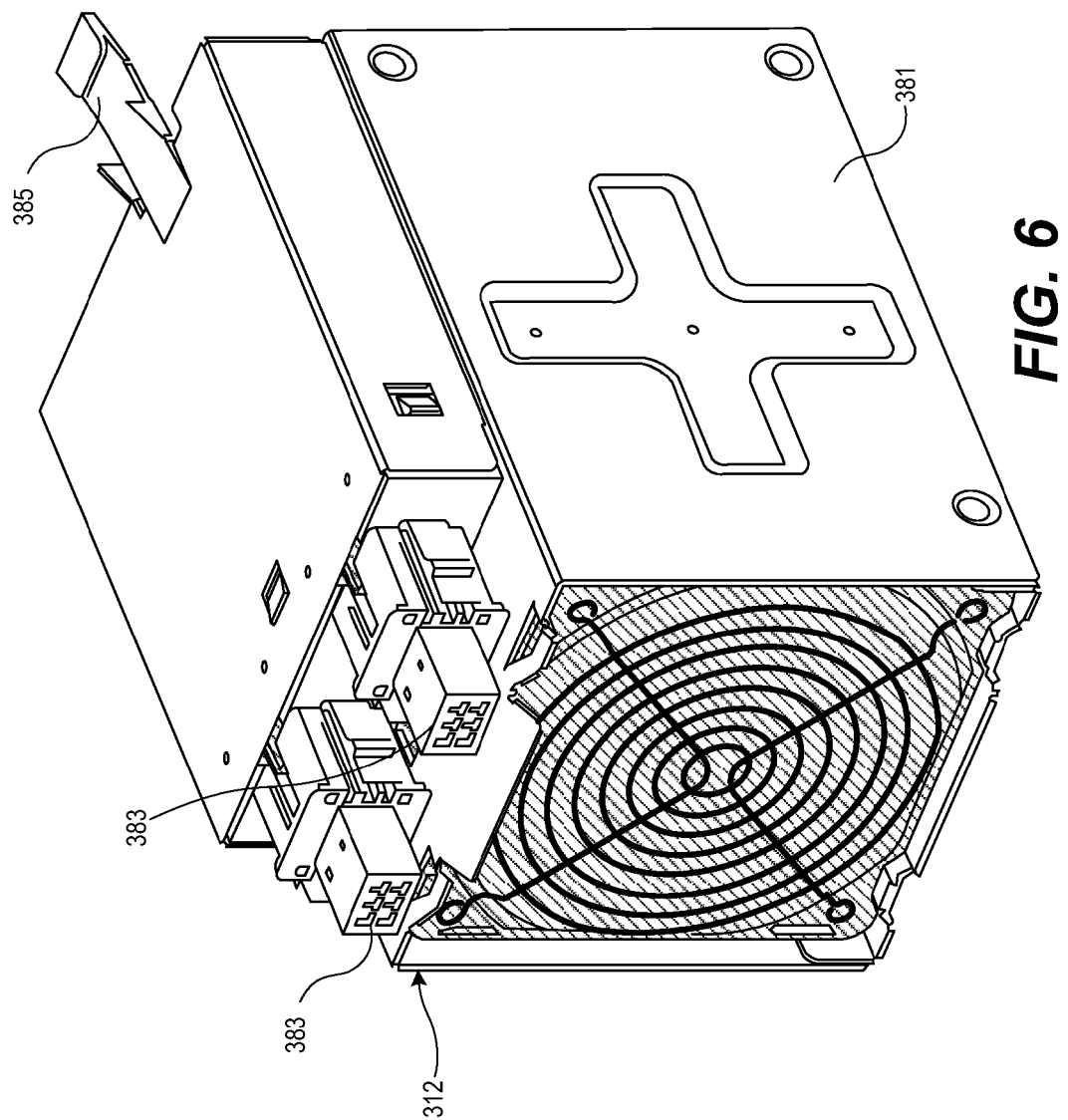
FIG. 6 illustrates an isometric intake side view of an example fan for cooling an IHS, according to one or more embodiments.
Figure 7:
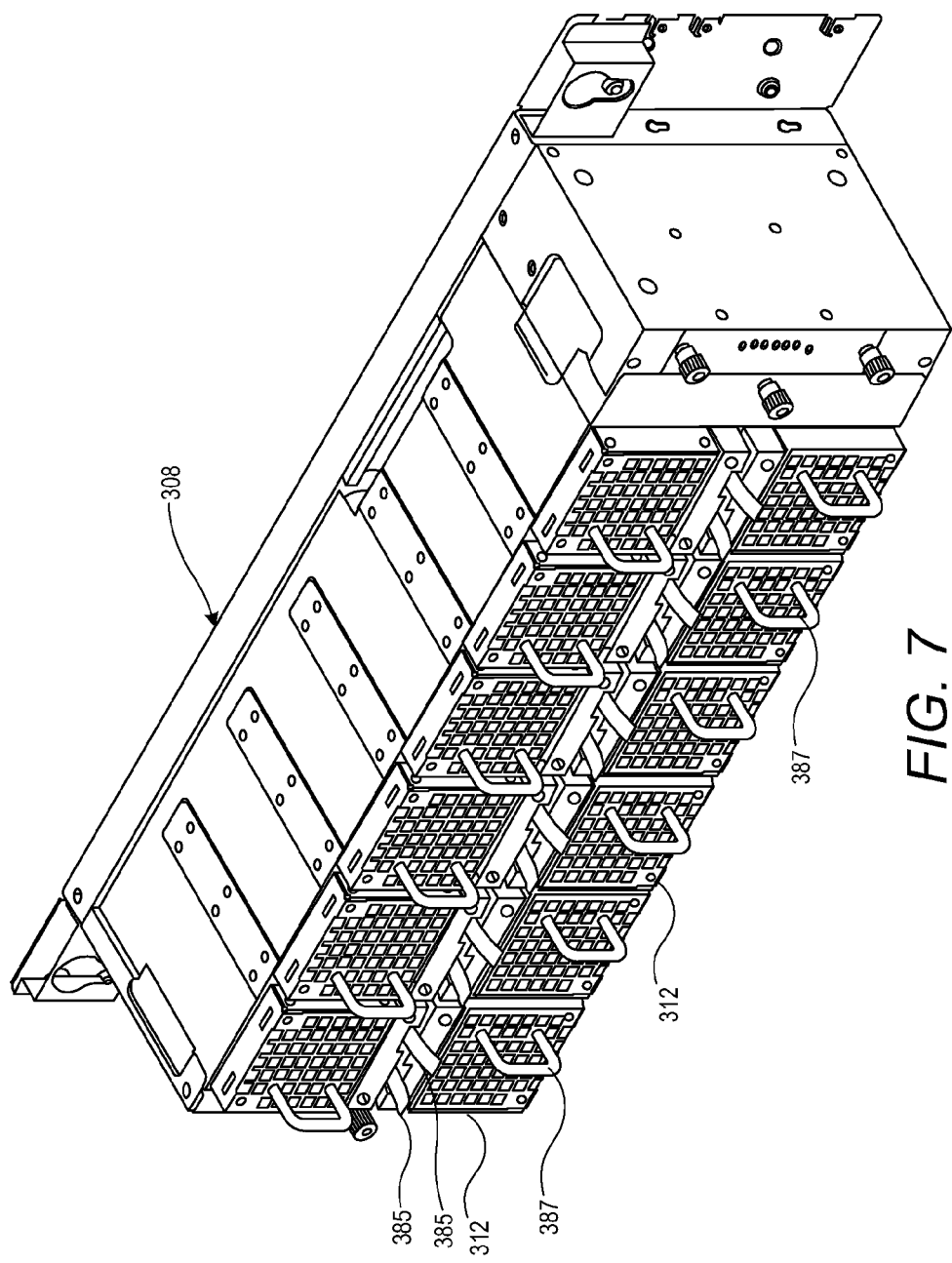
FIG. 7 illustrates an isometric exhaust side view of a fan bay receptacle with inserted fans, according to one embodiment.
Figure 8:
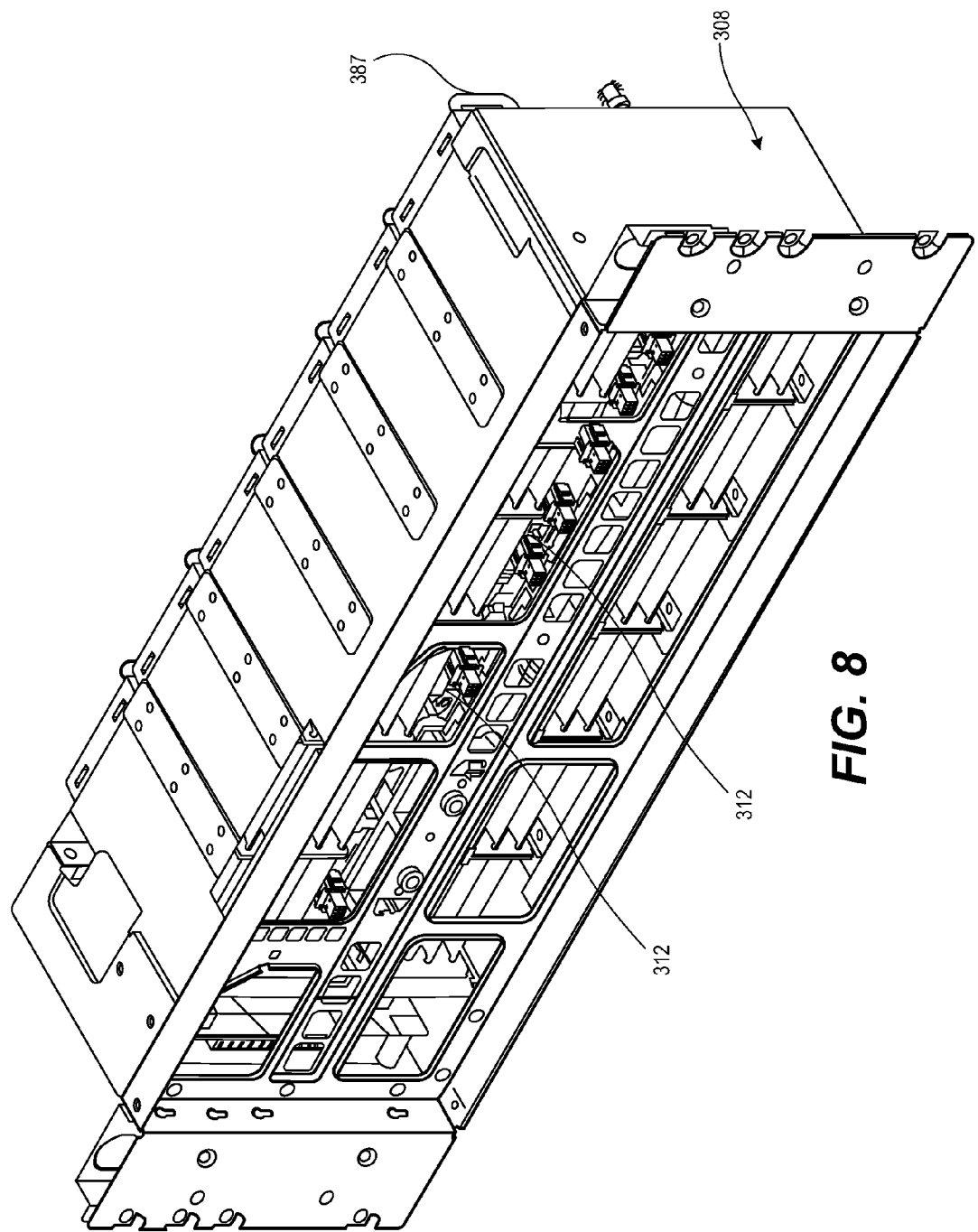
FIG. 8 illustrates an isometric intake view of the fan bay receptacle of FIG. 7, according to one embodiment.
Figure 9:
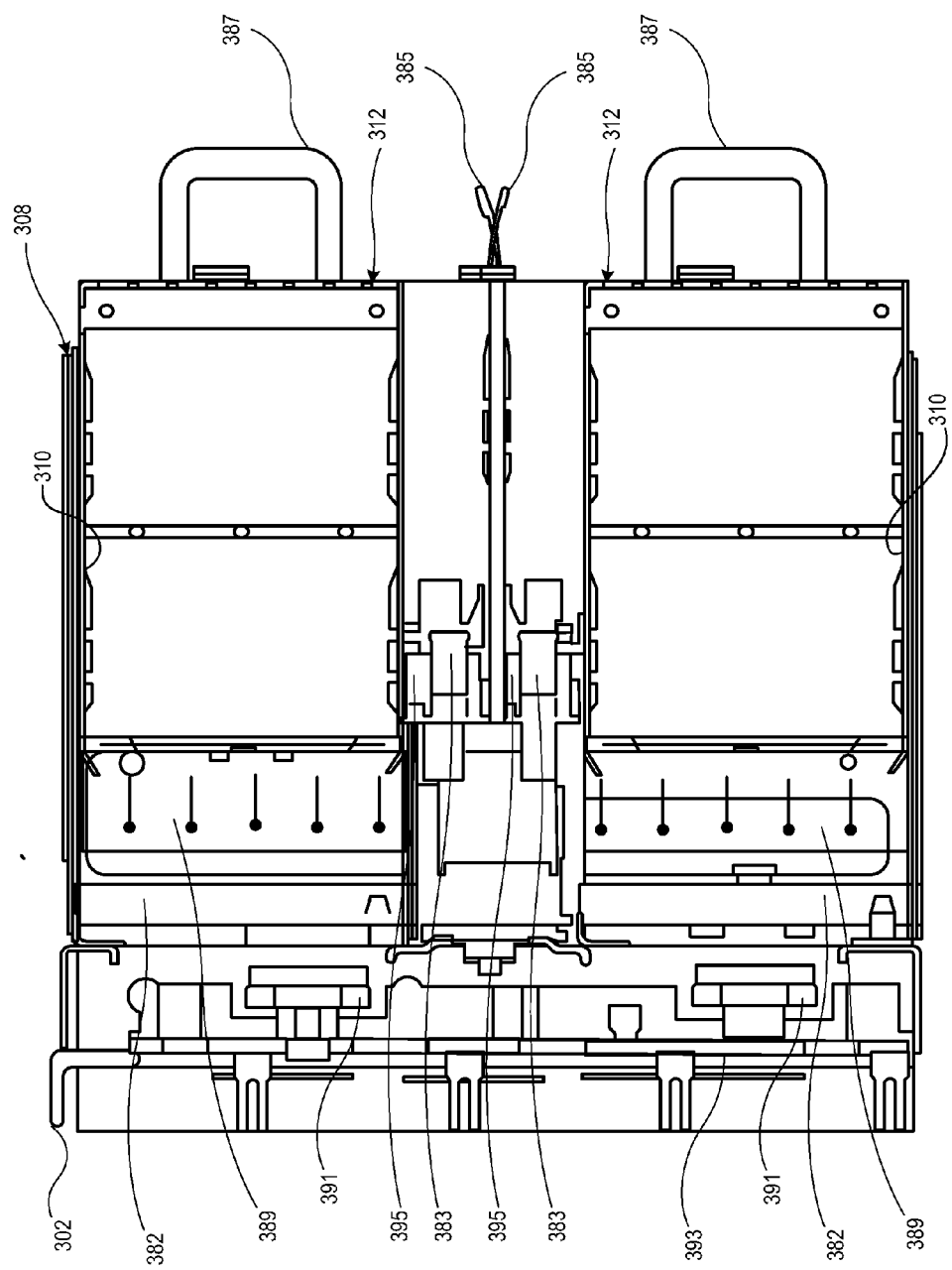
FIG. 9 illustrates a side view in vertical cross section of the fan bay receptacle of FIG. 7, according to one embodiment.

FIG. 6 illustrates an exemplary fan 312 having a fan casing 381 shaped for individual insertion and extraction. Forward aligned, male node connectors 383 are aligned to connect during insertion with a female node connector 395 (FIG. 9). A rearward extending clip 385 is provided for retention. FIGS. 7-8 illustrate fans 312 inserted into a fan bay module 308 by manually grasping a handle 387. FIG. 9 illustrates a side view of the fan bay module 308 attached to a rack 302 and cutaway to expose top and bottom fans 312. A respective flip 389 assists in retaining the fans 312 within the fan bay module 308. Electrical power is received by the fan bay module 308 at a vertical busbar 382 that is in electrical communication with a cross busbar 391 that delivers electrical power to a power interface board 393 for distribution within a block 374. Female node connectors 395 aligned rearward in a fan receptacle 310 of the fan bay module 308 receive the male node connectors 383 respectively.

Figure 10:
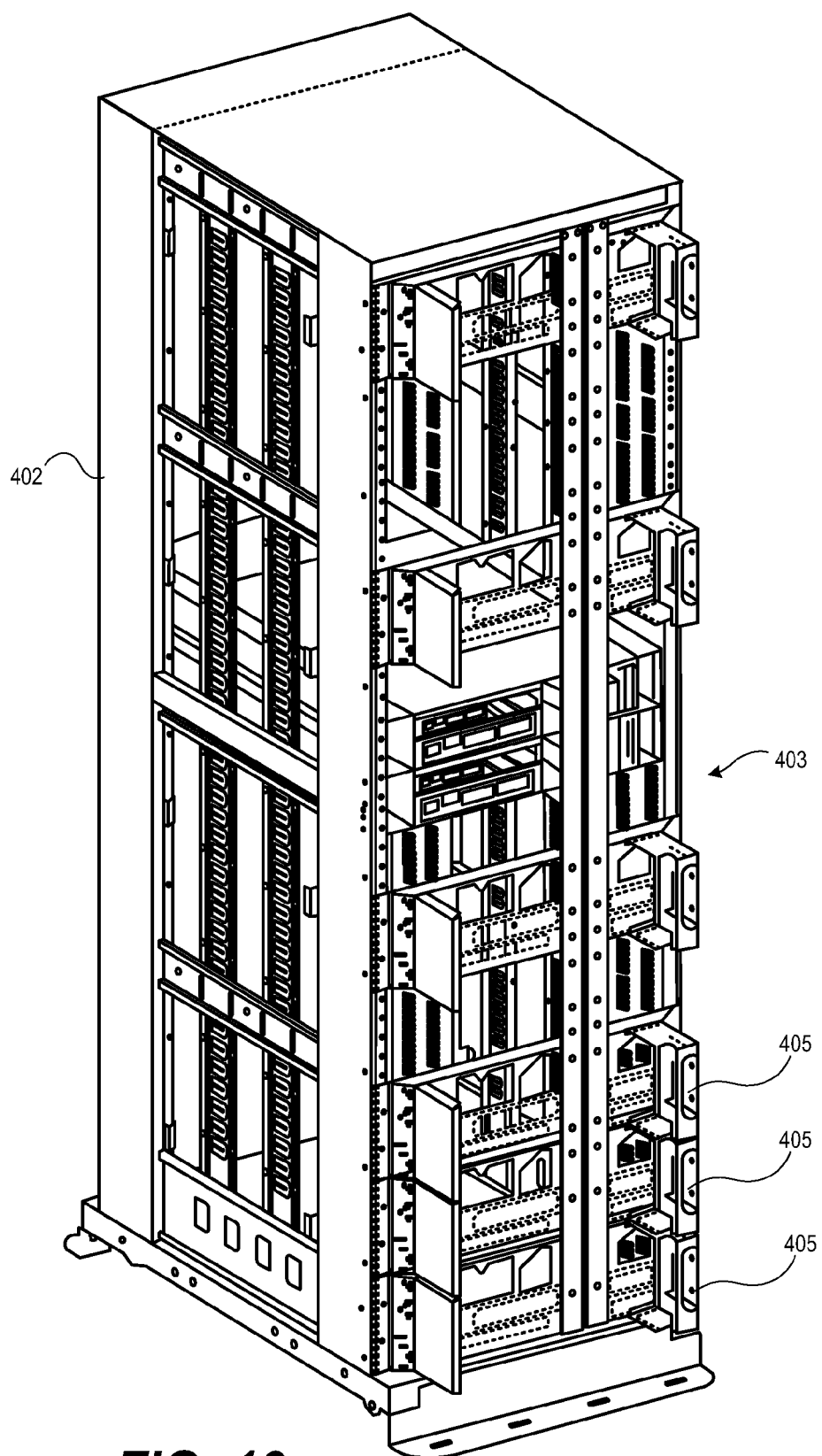
FIG. 10 illustrates an isometric rear view of a rack of an IHS, according to one embodiment.
Figure 11:
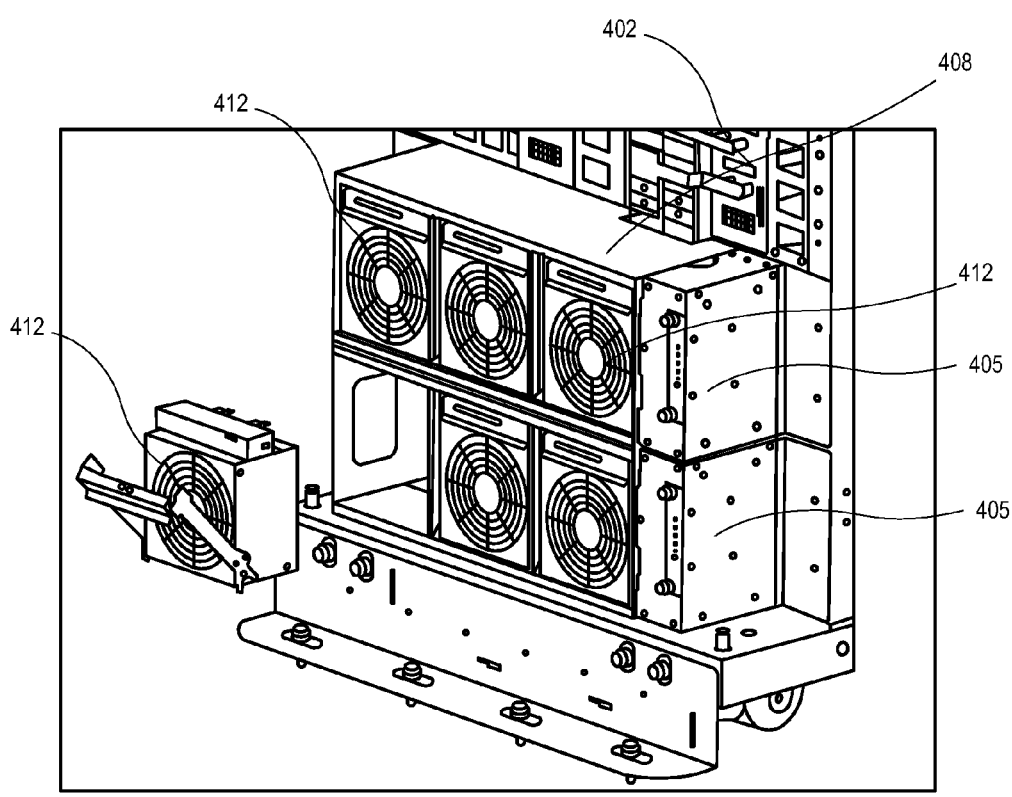
FIG. 11 illustrates an isometric rear view of a lower portion of the rack of FIG. 10 with two fan bay modules attached with one fan removed.

FIGS. 10-11 illustrate an example rack 402 having a back side 403 that includes cooling system attachments 405. With particular reference to FIG. 11, fans 412 are individually inserted into fan bay module 408 that is received in turn by the cooling system attachments 405.

Figure 12:
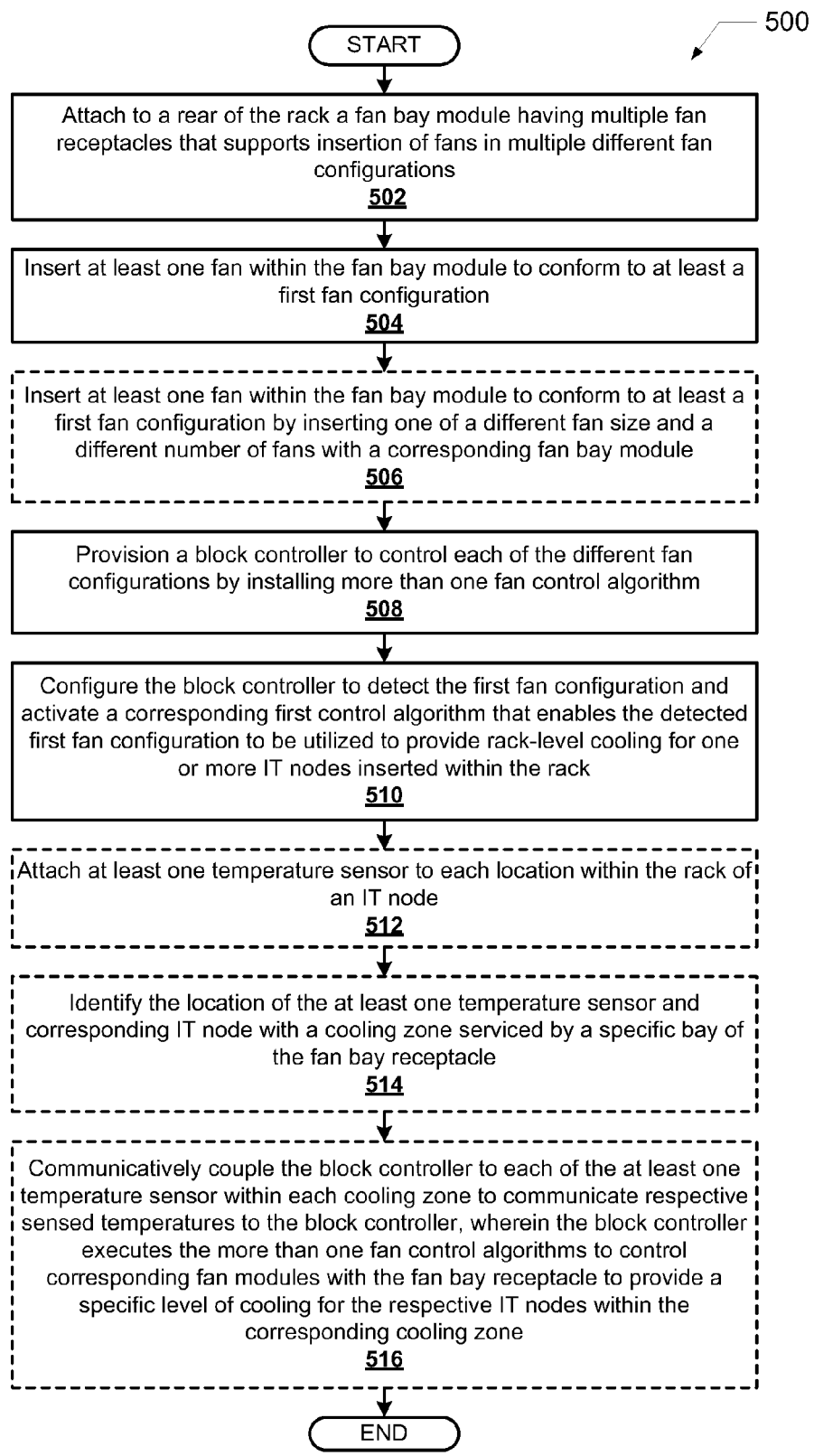
FIG. 12 illustrates a flow diagram of a method for implementing a scalable and modular fan design with centralized rack-level control within a modularly-configured and scalable IHS rack, according to one embodiment.

FIG. 12 illustrates a method 500 for implementing a scalable and modular fan design with centralized rack-level control within a scalable IHS rack having different numbers and sizes of IT gear, according to one embodiment. The method includes, in block 502, attaching to a rear of the rack a fan bay module having multiple fan receptacles that supports insertion of fans in multiple different fan configurations. In block 504, at least one fan is inserted within the fan bay module to conform to at least a first fan configuration. In one embodiment, at least one fan is inserted within the fan bay module to conform to at least a first fan configuration by inserting one of a different fan size and a different number of fans within a corresponding fan bay module (block 506).

In block 508, a fan controller, such as the block controller, is provisioned to control each of the different fan configurations by installing more than one fan control algorithms and controlling firmware. The block controller is configured in block 510 to detect the first fan configuration and activate a corresponding first control algorithm that enables the detected first fan configuration to be utilized to provide zone-specific cooling for one or more IT nodes inserted within the a specific zone of the rack. Each of the multiple block controllers then implement rack-level cooling of the RIHS 200.

In one embodiment, cooling control is performed at a zone level with respect to one or more temperature sensors, or data related to microprocessor-based temperature sensing and power drain, that are available to a single block controller. Alternatively or in addition, cooling control can be performed at a rack level, where an infrastructure manager for the RIHS 200 orchestrates overall cooling requirements via control signals to one or more block controllers. For example, additional cooling of one zone can create a heat sink for another zone of the rack that is not being adequately cooled.

In one embodiment, at least one temperature sensor is attached to each location within the rack of an IT node, as illustrated in block 512. The location of the at least one temperature sensor and corresponding IT node are identified with a cooling zone serviced by a specific bay of the fan bay receptacle (block 514). The method 500 further includes communicatively coupling the block controller to each of the at least one temperature sensor within each cooling zone to communicate respective sensed temperatures to the block controller. Thereby, the block controller in block 516 can execute the more than one fan control algorithms to control corresponding fans within the fan bay module to provide a specific level of cooling for the respective IT nodes within the corresponding cooling zone.

Figure 13:
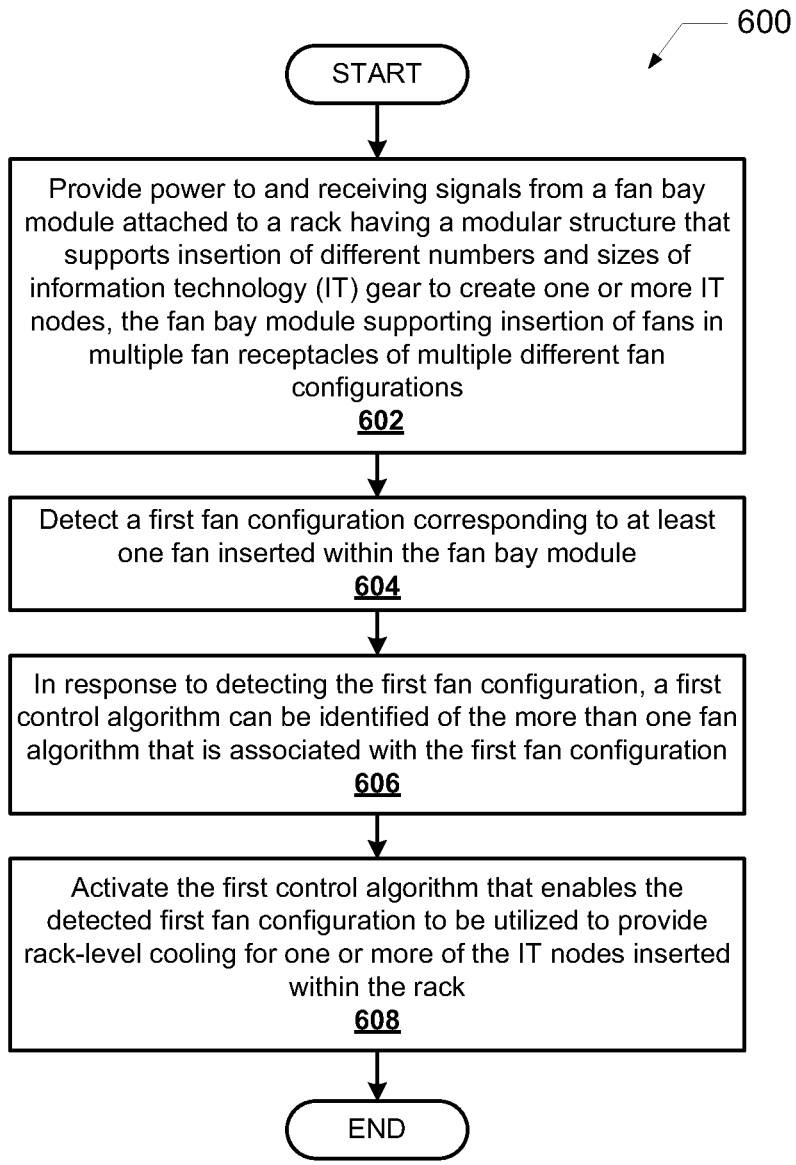
FIG. 13 illustrates a flow diagram of a method for centralized rack-level control of a scalable and modular fan design within a modularly-configured and scalable IHS rack, according to one embodiment.

FIG. 13 illustrates a method 600 for centralized rack-level control of a scalable and modular fan design within a scalable IHS rack, according to one embodiment. The method includes providing power to and receiving signals from a fan bay module attached to a rack having a modular structure that supports insertion of different numbers and sizes of IT gear to create one or more IT nodes. In particular, fans are inserted in multiple fan receptacles of the fan bay module that supports multiple different fan configurations (block 602). The method 600 further includes in block 604 detecting a first fan configuration of the multiple different fan configurations corresponding to at least one fan inserted within the fan bay module, wherein the multiple different fan configurations are associated respectively with more than one fan algorithm. In block 606, in response to detecting the first fan configuration, a first control algorithm can be identified of the more than one fan algorithms that is associated with the first fan configuration. In block 608, the method includes activating the first control algorithm that enables the detected first fan configuration to be utilized to provide zone-level cooling for one or more of the IT nodes inserted within the rack.

In the above described flow charts of FIGS. 12-13, one or more of the methods may be embodied in a computer readable device containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack-based information handling system (IHS), comprising:
   a rack having a modular structure that supports insertion of different numbers and sizes of information technology (IT) gear to create one or more IT nodes;
   a fan bay module attached to the rack and configured with more than one fan receptacle, the fan bay module supporting insertion of multiple different fan configurations in the more than one fan receptacle, wherein the fan bay module supports insertion of: a first fan configuration having a first number of fans within a single fan bay module, the first fan configuration controllable via a first control algorithm; and a second fan configuration having a second, different number of fans within a single fan bay module, the second fan configuration controllable via a second control algorithm;
   at least one fan inserted within a corresponding fan receptacle of the fan bay module to conform to at least a first fan configuration;
   a block controller that is configurable to control each of the different fan configurations and which, in response to detecting the first fan configuration of the at least one fan inserted within the fan bay module, automatically activates a corresponding first control algorithm that enables the detected first fan configuration to be utilized to provide rack-level cooling for one or more of the IT nodes inserted within the rack, wherein each fan bay module is assigned to cool a different set of components within the rack and is separately controllable via the single block controller executing respective first and second control algorithms, wherein the block controller comprises a fan module interface;
   one or more cables connected between the fan module interface and the fan bay module to communicate signals and power between the block controller and the at least one fan, wherein the multiple different fan configurations are associated respectively with a corresponding unique wiring configuration that is electrically communicated to the fan module interface by the one or more cables; and wherein the block controller is further configurable to determine a fan configuration of each fan module based on the wiring configuration sensed at the fan module interface.

2. The rack-based IHS of claim 1, wherein:
the fan bay module supports insertion of multiple different fan configurations including a first fan configuration having fans of a first size within a single fan bay module and a second fan configuration having fans of a second, different size within a single fan bay module, each fan bay module assigned to cool a different set of components within the rack and being separately controllable via the single block controller.

3. The rack-based IHS of claim 1, wherein:
the fan bay module supports concurrent insertion of multiple different fan configurations, including a first fan configuration having a first number of fans of a first size within a first single fan bay module and a second fan configuration having a second number of fans of a second size within a next single fan bay module, each fan bay module assigned to cool a different set of components within the rack and being separately controllable via the single block controller.

4. The rack-based IHS of claim 3, further comprising:
at least one cooling zone identified within the rack at a location of one or more IT nodes that require cooling by one or more fans within an adjacent fan bay module;
wherein the block controller is further configured to control a speed of the one or more fans in response to a determination, based upon (i) information about the IT gear located at the at least one cooling zone and (ii) a relative size and number of fans within the one or more fan bay modules that service the at least one cooling zone.

5. The rack-based IHS of claim 1, further comprising:
at least one cooling zone identified within the rack at a location of one or more IT nodes that require cooling by one or more fans within the fan bay module;
at least one temperature sensor positioned within a location of each IT node corresponding to each cooling zone serviced by fans within the fan bay module;
wherein each fan receptacle of the fan bay module is delineated according to which cooling zone is serviced by fans placed at the specific fan receptacle within the fan bay module; and
wherein the block controller is configurable to:
  detect a respective fan configuration of the multiple different fan configurations for each of the more than one cooling zone;
  detect a sensed temperature from a respective temperature sensor corresponding to each of the more than one cooling zone;
  activate a corresponding control algorithm that enables the detected respective fan configuration to be utilized to provide rack-level cooling for the one or more IT nodes of the more than one cooling zone; and
  trigger a fan speed of the one or more fans of a particular fan bay module based on a sensed temperature from the at least one temperature sensor at the corresponding cooling zone serviced by the fan bay module.

6. The rack-based IHS of claim 1, wherein the corresponding unique wiring configuration comprises a selected one or more of: (i) a number of the one or more cables, (ii) a first subset of allowable conductors of a cable connector of the one or more cables, and (iii) a second subset of conductors of the one or more cable connectors that are in electrical communication with the at least one fan.

7. A cooling system for an information handling system (IHS) having a rack of a modular structure that supports insertion of different numbers and sizes of information technology (IT) gear to create one or more IT nodes, the cooling system comprising:
a fan bay module attached to the rack and which supports insertion of multiple different fan configurations in more than one fan receptacle, wherein the fan bay module supports insertion of: a first fan configuration having a first number of fans within a single fan bay module, the first fan configuration controllable via a first control algorithm; and a second fan configuration having a second, different number of fans within a single fan bay module, the second fan configuration controllable via a second control algorithm;
at least one fan inserted within the at least one fan receptacle of the fan bay module to conform to at least a first fan configuration;
a block controller that is configurable to control each of the multiple different fan configurations and which, in response to detecting the first fan configuration of the at least one fan inserted within the fan bay module, activates an associated first control algorithm that enables the detected first fan configuration to be utilized to provide rack-level cooling for one or more of the IT nodes inserted within the rack adjacent to the at least one fan within the at least one fan receptacle, wherein each fan bay module is assigned to cool a different set of components within the rack and is separately controllable via the single block controller executing respective first and second control algorithms, the block controller comprising a fan module interface;
one or more cables connected between the fan module interface and the fan bay module to communicate signals and power between the block controller and the at least one fan, wherein the multiple different fan configurations are associated respectively with a corresponding unique wiring configuration that is electrically communicated to the fan module interface by the one or more cables; and
wherein the block controller is further configurable to determine a fan configuration of each fan bay module based on the wiring configuration sensed at the fan module interface.

8. The cooling system of claim 7, wherein:
the fan bay module supports insertion of multiple different fan configurations including a first fan configuration having fans of a first size within a single fan bay module and a second fan configuration having fans of a second, different size within a single fan bay module, each fan bay module assigned to cool a different set of components within the rack and being separately controllable via the single block controller.

9. The cooling system of claim 7, wherein:
the fan bay module supports concurrent insertion of multiple different fan configurations, including a first fan configuration having a first number of fans of a first size within a single fan bay module and a second fan configuration having a second number of fans of a second size within a single fan bay module, each fan bay module assigned to cool a different set of components within the rack and being separately controllable via the single block controller.

10. The cooling system of claim 9, wherein:
at least one cooling zone identified within the rack that corresponds to a location of one or more IT nodes that require cooling by one or more fans within the fan bay module; and
wherein the block controller further configured to control speed of the fan in response to a determination based upon information about the IT gear located at the least one cooling zone and a relative size and number of fans within the one or more fan bay modules that service the at least one cooling zone.

11. The cooling system of claim 7, wherein at least one cooling zone is identified within the rack that corresponds to a location of one or more IT nodes that require cooling by one or more fans within the fan bay module, the cooling system further comprising:
at least one temperature sensor positioned within a location of each IT nodes corresponding to each cooling zone serviced by fans within the fan bay module;
wherein each fan receptacle of the fan bay module is delineated according to which cooling zone is serviced by fans placed at the specific fan receptacle within the fan bay module; and
wherein the block controller is configurable to:
detect a respective fan configuration of the multiple different fan configurations for the more than one cooling zone;
detect a sensed temperature from a respective temperature sensor corresponding to the more than one cooling zone;
activate a corresponding control algorithm that enables the detected respective fan configuration to be utilized to provide rack-level cooling for the one or more IT nodes of the more than one cooling zone; and
trigger a fan speed of the one or more fans of a particular fan bay module based on a sensed temperature from the at least one temperature sensor at the corresponding cooling zone serviced by the fan bay module.

12. The cooling system of claim 7, wherein the corresponding unique wiring configuration comprises a selected one or more of: a number of the one or more cables; a first subset of allowable conductors of a cable connector of the one or more cables; and a second subset of conductors of the one or more cable connectors that are in electrical communication with the at least one fan.

13. A method for implementing a scalable and modular fan design with centralized rack-level control within a modular, scalable information handling system (IHS) rack having different numbers and sizes of information technology (IT) gear, the method comprising:
attaching to a rear of the rack a fan bay module having multiple fan receptacles that supports insertion of fans in multiple different fan configurations, wherein the fan bay module supports insertion of: a first fan configuration having a first number of fans within a single fan bay module, the first fan configuration controllable via a first control algorithm; and a second fan configuration having a second, different number of fans within a single fan bay module, the second fan configuration controllable via a second control algorithm;
inserting at least one fan within the fan bay module to conform to at least a first fan configuration;
provisioning a block controller to control each of multiple different fan configurations by installing more than one fan control algorithm; and
configuring the block controller to detect the first fan configuration and activate a corresponding first control algorithm that enables the detected first fan configuration to be utilized to provide rack-level cooling for one or more IT nodes inserted within the rack adjacent to the IT nodes;
wherein each fan bay module is assigned to cool a different set of components within the rack and is separately controllable via the single block controller executing respective first and second control algorithms;
wherein the block controller comprises a fan module interface;
wherein the IHS rack comprises one or more cables connected between the fan module interface and the fan bay module to communicate signals and power between the block controller and the at least one fan;
wherein each fan configuration of the multiple different fan configurations is associated with a corresponding unique wiring configuration that is electrically communicated to the fan module interface by the one or more cables; and
wherein the method further comprises configuring the block controller to determine a fan configuration of each fan module based on the wiring configuration sensed at the fan module interface.

14. The method of claim 13, wherein each different fan configuration includes one of a different fan size and a different number of fans within a corresponding fan bay module.

15. The method of claim 13, further comprising:
attaching at least one temperature sensor to each location within the rack of an IT node;
identifying the location of the at least one temperature sensor and corresponding IT node with a cooling zone serviced by a specific bay of the fan bay receptacle; and
communicatively coupling the block controller to each of the at least one temperature sensor within each cooling zone to communicate respective sensed temperatures to the block controller, wherein the block controller executes the more than one fan control algorithm to control corresponding fans within the fan bay receptacle to provide a specific level of cooling for the respective IT nodes within the corresponding cooling zone.

16. A method for centralized rack-level control of a scalable and modular fan design within a scalable information handling system (IHS) rack, the method comprising:
providing power to and receiving signals from a fan bay module attached to a rack having a modular structure that supports insertion of different numbers and sizes of information technology (IT) gear to create one or more IT nodes, the fan bay module supporting insertion of fans in multiple fan receptacles of multiple different fan configurations including: a first fan configuration having a first number of fans within a single fan bay module, the first fan configuration controllable via a first control algorithm; and a second fan configuration having a second, different number of fans within a single fan bay module, the second fan configuration controllable via a second control algorithm;

detecting a first fan configuration from among the multiple different fan configurations, each corresponding to at least one fan inserted within the fan bay module, wherein the multiple different fan configurations are associated respectively with more than one fan algorithm;

in response to detecting the first fan configuration, identifying a first control algorithm from among the more than one fan algorithm that is associated with the first fan configuration; and activating the first control algorithm that enables the detected first fan configuration to be utilized to provide rack-level cooling for one or more of the IT nodes inserted within the rack adjacent to a location of the at least one fan;

wherein each fan bay module is assigned to cool a different set of components within the rack and is separately controllable via the single block controller executing respective first and second control algorithms;

wherein the block controller comprises a fan module interface;

wherein the IHS rack comprises one or more cables connected between the fan module interface and the fan bay module to communicate signals and power between the block controller and the at least one fan;

wherein each fan configuration of the multiple different fan configurations is associated with a corresponding unique wiring configuration that is electrically communicated to the fan module interface by the one or more cables; and wherein the method further comprises configuring the block controller to determine a fan configuration of each fan module based on the wiring configuration sensed at the fan module interface.

\* \* \* \* \*